United States Patent
Ishiguro et al.

(10) Patent No.: US 8,952,241 B2
(45) Date of Patent: Feb. 10, 2015

(54) SOLAR CELL MODULE

(75) Inventors: Tasuku Ishiguro, Kobe (JP); Atsushi Saita, Kobe (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 13/593,904

(22) Filed: Aug. 24, 2012

(65) Prior Publication Data

US 2012/0312359 A1 Dec. 13, 2012

Related U.S. Application Data (63) Continuation of application No. PCT/JP2011/053896, filed on Feb. 23, 2011.

(30) Foreign Application Priority Data

Feb. 25, 2010 (JP) .................................. 2010-040678

(51) Int. Cl.
*H01L 31/048* (2014.01)

(52) U.S. Cl.
CPC ............. *H01L 31/0481* (2013.01); *Y02E 10/50* (2013.01)
USPC ......................................... 136/251; 136/259

(58) Field of Classification Search
None
See application file for complete search history.

(56) References Cited

U.S. PATENT DOCUMENTS

2007/0227584 A1* 10/2007 Tsunomura et al. .......... 136/251
2008/0041434 A1*  2/2008 Adriani et al. ................ 136/244

FOREIGN PATENT DOCUMENTS

| JP | 10-341030 A | 12/1998 |
| JP | 11-112007 A | 4/1999 |
| JP | 11-261085 A | 9/1999 |
| JP | 2004-214641 A | 7/2004 |
| JP | 2005-129926 A | 5/2005 |
| JP | 2006-303233 A | 11/2006 |
| JP | 2009-81197 A | 4/2009 |

* cited by examiner

*Primary Examiner* — Jayne Mershon
(74) *Attorney, Agent, or Firm* — Marvin A. Motsenbocker; Mots Law, PLLC

(57) ABSTRACT

A solar cell module includes a protective body, a sheet facing the protective body, a filler layer provided between the protective body and the sheet, and a solar cell disposed inside the filler layer. The filler layer has a first filler layer and a second filler layer. The first filler layer is provided in contact with the sheet. The first filler layer is formed of a resin. The second filler layer is formed of a resin whose gel fraction is higher than 0% and is less than a gel fraction of the resin of the first filler layer.

8 Claims, 6 Drawing Sheets

SOLAR CELL MODULE

CROSS REFERENCE TO RELATED APPLICATIONS

This application is a continuation application of International Application No. PCT/JP2011/053896, filed on Feb. 23, 2011, entitled "SOLAR CELL MODULE", which claims priority based on Article 8 of Patent Cooperation Treaty from prior Japanese Patent Applications No. 2010-040678, filed on Feb. 25, 2010, the entire contents of which are incorporated herein by reference.

BACKGROUND OF THE INVENTION

1. Field of the Invention

This disclosure relates to a solar cell module. In particular, this disclosure relates to a solar cell module including a solar cell disposed in a filler layer provided between a protective body and a sheet.

2. Description of Related Art

Recently, solar cell modules have attracted greater attention as an energy source with a low environmental load.

A solar cell module includes solar cells configured to generate power by receiving light. The solar cells are easily deteriorated when coming in contact with water or the like. For this reason, the solar cells have to be isolated from the outside air. Accordingly, the solar cells are usually disposed inside a filler layer provided between a protective body and a sheet. In other words, the solar cells are sealed with the filler layer.

Examples of the material of the filler layer include resins such as ethylene-vinyl acetate copolymer (EVA). Such a material of the filler layer is disclosed in Document 1 (Japanese Patent Application Publication No. 2005-129926).

DOCUMENT 1: Japanese Patent Application Publication No. 2005-129926

SUMMARY OF THE INVENTION

However, even when a resin-made filler layer is provided, there is still a problem that a solar cell module excellent in both weather resistance and heat resistance is hard to be obtained.

An object of an embodiment of the invention is to provide a solar cell module with both improved weather resistance and improved heat resistance.

The inventors have found as a result of earnest studies that both excellent weather resistance and excellent heat resistance can be obtained by manipulating a gel fraction of a filler layer formed of a resin. Specifically, the inventors have found the following. In a filler layer provided between a protective body and a sheet, a gel fraction of at least part of one portion of the filler layer in contact with the sheet is increased, and a portion whose gel fraction is higher than 0% and is lower than that of the one portion in contact with the sheet is provided in another portion. This makes it possible to obtain both improved weather resistance and improved heat resistance at the same time. Consequently, the inventors have made the invention.

An aspect of the invention is a solar cell module including a protective body, a sheet, a filler layer, and a solar cell. The sheet faces the protective body. The filler layer is provided between the protective body and the sheet. The solar cell is provided inside the filler layer. The filler layer includes a first filler layer and a second filler layer. The first filler layer is provided in contact with the sheet. The first filler layer is formed of a resin. The second filler layer is formed of a resin whose gel fraction is higher than 0% and is less than a gel fraction of the resin of the first filler layer.

In this disclosure, the "gel fraction" is measured by the following measuring method. First, 1 g of a resin to be a measurement target is prepared. The resin is soaked in 100 ml of xylene at 120° C. for 24 hours. After that, residual materials in the xylene are taken out and dried at 80° C. for 16 hours. Thereafter, the mass of the dried residual materials is measured. A gel fraction (%) is calculated based on the following equation (1) from the obtained results.

$$(\text{Gel fraction (\%)}) = (\text{Mass of residual materials }(g)) / (\text{Mass of a resin before being soaked }(g)) \qquad (1)$$

The gel fraction of the resin of the first filler layer may be equal to or higher than 60%.

The gel fraction of the resin of the first filler layer may be equal to or higher than 1.5 times of the gel fraction of the resin of the second filler layer.

Each of the resin of the first filler layer and the resin of the second filler layer may be ethylene-vinyl acetate copolymer or polyethylene.

The first filler layer may be in contact with a solar cell.

The solar cell may be disposed between the first filler layer and the second filler layer.

The solar cell may be disposed inside the second filler layer.

The solar cell may be disposed inside the first filler layer.

The first filler layer may be provided in contact with both the protective body and the sheet.

The second filler layer may be provided in contact with both the protective body and the sheet.

The first filler layer may be disposed to surround the second filler layer.

The protective body may be a glass plate and the sheet may be a resin sheet.

The solar cell may be configured to receive light from the protective body side.

The aspect can provide a solar cell module having both improved weather resistance and improved heat resistance.

DETAILED DESCRIPTION OF EMBODIMENTS

Hereinafter, preferable embodiments in which the invention is implemented are described using solar cell modules 1a to 11 shown in FIGS. 1 to 12 as examples. However, the solar cell modules 1a to 11 are only exemplary. The invention is not limited to the solar cell modules 1a to 11.

Also, in each drawing referred in the following embodiments, members having substantially the same functions are referred by the same reference numerals. Note that the drawings referred in the embodiments are merely schematically shown and proportions of sizes and the like may be different from actual ones. In addition, there are also included portions where relationships or percentages of sizes of the drawings are different with respect to one another. Note that the drawings are merely schematically shown and proportions of sizes and the like are different from actual ones. Thus, specific sizes and the like should be judged by referring to the description below.

First Embodiment

Figure 1:
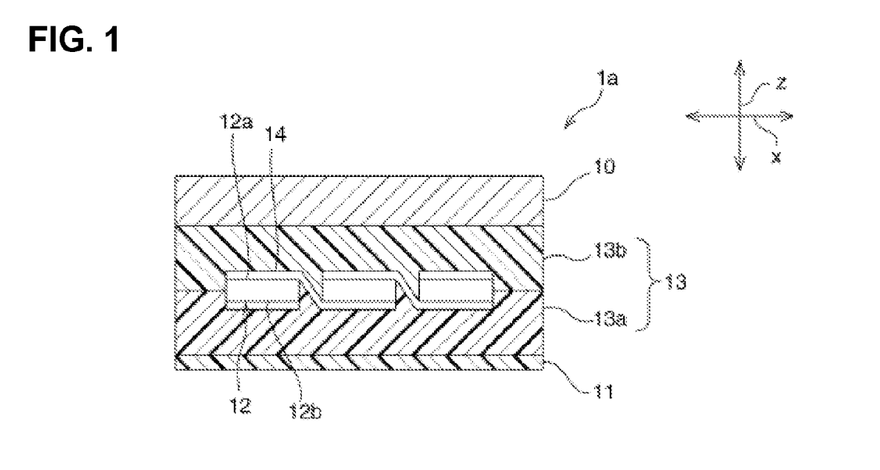
FIG. 1 is a schematic cross-sectional view of a solar cell module according to a first embodiment.

FIG. 1 is a schematic cross-sectional view of a solar cell module according to a first embodiment.

As shown in FIG. 1, solar cell module 1a includes protective body 10, sheet 11, filler layer 13, and solar cell 12.
(Protective Body 10 and Sheet 11)

Protective body 10 and sheet 11 have a function as a protective member for solar cell 12. Protective body 10 is a member which secures a mechanical strength of solar cell module 1a. Protective body 10 is not particularly limited as long as it is a rigid member. Protective body 10 can be formed of a glass plate, a resin plate, or the like. Among these, protective body 10 is preferably formed of a glass plate. This is because a glass plate has high rigidity and light transmittance and is excellent in weather resistance.

Note that a thickness of protective body 10 is not particularly limited. For example, the thickness of protective body 10 may be approximately 3 mm to 6 mm.

Sheet 11 faces protective body 10. Sheet 11 is not particularly limited as long as it is a flexible member. For example, sheet 11 can include a resin sheet made of a resin such as polyethylene terephthalate (PET) or the like. Note that a light shield foil such as an aluminum foil or an inorganic barrier layer with low water permeability or the like may be provided inside the resin sheet constituting sheet 11. The inorganic barrier layer may be formed of an inorganic material such as a silicon oxide or alumina.

Note that a thickness of sheet 11 is not particularly limited. For example, the thickness of sheet 11 may be approximately 150 μm to 300 μm.

Filler layer 13 is filled between protective body 10 and sheet 11. Also, filler layer 13 is a member for sealing solar cell 12. For this reason, filler layer 13 is also referred to as a sealing layer. The configuration of filler layer 13 is described later.

(Solar Cell 12)

A plurality of solar cells 12 are disposed inside the filler layer 13. The plurality of solar cells 12 are arranged along an arrangement direction x perpendicular to a stacking direction z of protective body 10, filler layer 13, and sheet 11. The plurality of solar cells 12 may be disposed in a matrix pattern on a plane whose normal direction is the stacking direction z.

The plurality of solar cells is electrically connected in series or in parallel with wiring member 14. Note that solar cell 12 and wiring member 14 may be connected with each other using a solder, a conductive resin adhesive in which conductive particles are dispersed in a resin, or the like. When the resin adhesive is used, it is preferable that the resin adhesive have anisotropy.

Solar cell 12 has light-receiving surface 12a receiving light and rear surface 12b opposite to light-receiving surface 12a. In the embodiment, each of solar cells 12 is disposed such that light-receiving surface 12a is oriented to the protective body 10 side and rear surface 12b is oriented to the sheet 11 side. In other words, in the embodiment, each of solar cells 12 receives light from the protective body 10 side. However, the invention is not limited to this configuration. For example, the solar cell may be disposed such that the light-receiving surface is oriented to the sheet side and the rear surface is oriented to the protective body side. Also, both principal surfaces of the solar cell may be light-receiving surfaces.

The configuration of solar cell 12 is not particularly limited. For example, solar cell 12 may be a HIT (registered trademark) solar cell having the HIT structure or other configurations.

In general, solar cell 12 includes a photoelectric converter to generate carriers (electrons and holes) by receiving light. The photoelectric converter includes a semiconductor material having a semiconductor junction such as a pn junction or a pin junction. Examples of the semiconductor material include, for example, a crystalline silicon semiconductor such as a monocrystalline silicon or polycrystalline silicon, amorphous silicon semiconductor, and a composite semiconductor such as non-crystalline silicon semiconductor or GaAs.

An electrode configured to collect carriers is provided on each of the first and second principal surfaces of the photoelectric converter. A plurality of solar cells 12 are electrically connected by being connected with wiring member 14 to each of the electrodes of adjacent solar cells 12. Note that the electrode generally includes a plurality of fingers extending parallel with each other and one or a plurality of bus bars which extend in a direction perpendicular to the direction in which the fingers extend and are respectively connected with the plurality of fingers.
(Filler Layer 13)

Hereinafter, the configuration of filler layer 13 in the embodiment is described in detail.

Filler layer 13 has first filler layer 13a and second filler layer 13b.

First filler layer 13a is provided in contact with sheet 11. Specifically, in the embodiment, first filler layer 13a and second filler layer 13b are stacked in this order from the sheet 11 side between sheet 11 and protective body 10. Sheet 11 and first filler layer 13a are bonded with each other. First and second filler layers 13a and 13b are also bonded with each other. Second filler layer 13b and protective body 10 are also bonded with each other.

Solar cell 12 is disposed in a boundary between first filler layer 13a and second filler layer 13b. Thus, first filler layer 13a is in contact with solar cell 12. Note that in FIG. 1, although the boundary between first filler layer 13a and second filler layer 13b is conveniently depicted as if it is in a region where solar cell 12 is provided in the stacking direction z, the boundary may be substantially flush with light-receiving surface 12a and rear surface 12b of solar cell 12 in the stacking direction z.

A thickness of each of first filler layer 13a and second filler layer 13b in the stacking direction z is not particularly limited. For example, the thickness of first filler layer 13a in the stacking direction z is preferably approximately 0.3 mm to 0.8 mm. For example, the thickness of second filler layer 13b in the stacking direction z is preferably approximately 0.3 mm to 0.8 mm. For example, the thickness of filler layer 13 in the stacking direction z is preferably approximately 0.6 mm to 2.0 mm. A ratio between the thickness of first filler layer 13a in the stacking direction z and the thickness of second filler layer 13b in the stacking direction z is preferably within a range of 1:2 to 2:1.

Each of first filler layer 13a and Second filler layer 13b is made of a resin. Each of first filler layer 13a and second filler layer 13b may be formed of only a resin or may contain additives such as a cross-linking agent or a coupling agent.

Although the resin of each of first and second filler layers 13a and 13b is not particularly limited, for example, it is preferably ethylene-vinyl acetate copolymer (EVA) or polyethylene which has a high optical transmittance and is excellent in weather resistance and heat resistance.

Gel fractions of the resin of first filler layer 13a and the resin of second filler layer 13b are higher than 0.1%. A gel fraction of the resin of second filler layer 13b is less than the gel fraction of the resin of first filler layer 13a.

Specifically, the gel fraction of the resin of first filler layer 13a is preferably equal to or higher than 50%, more preferably equal to or higher than 55%, and further more preferably equal to or higher than 60%. However, if the gel fraction of the resin of first filler layer 13a is excessively high, flexibility may be not maintainable. For this reason, the gel fraction of the resin of first filler layer 13a is preferably equal to or less than 90%, and more preferably equal to or less than 80%.

The gel fraction of the resin of second filler layer 13b is preferably less than 80%, more preferably equal to or less than 60%, further more preferably equal to or less than 51%, and further more preferably equal to or less than 40%.

The gel fraction of the resin of first filler layer 13a is preferably equal to or larger than 1.5 times of the gel fraction of the resin of second filler layer 13b.

Note that the gel fraction of a resin is a parameter correlating with a cross-linking density of the resin. As the cross-linking density of a resin is higher, the gel fraction of the resin tends to be higher, while as the cross-linking density of a resin is lower, the gel fraction of the resin tends to be lower. For this reason, the gel fraction of the resin can be adjusted by changing the cross-linking density of a resin. The cross-linking density of a resin can be adjusted by changing an amount of additive to form a cross-linking structure or a curing time for cross-linking. Note that the kind of cross-linking agent can be properly selected depending on the kind of a resin. Specific examples of the cross-linking agent include an organic peroxide or a silane coupling agent. Specific examples of organic peroxide include benzoyl peroxide, dicumyl-peroxide, 2,5-dimethyl-2,5-di(t-butylperoxy)hexane, and the like. Specific examples of the silane coupling agent include a compound in which a methoxy group or ethoxy group is introduced using γ-methacryloxypropyltrimethoxysilane or polysiloxane as a base.

As described above, in the embodiment, the gel fraction of the resin of second filler layer 13b is higher than 0% and is less than the gel fraction of the resin of first filler layer 13a. In other words, each of the gel fractions of first and second filler layers 13a and 13b is higher than 0% and the gel fraction of the resin of first filler layer 13a in contact with sheet 11 is relatively higher and the gel fraction of the resin of second filler layer 13b is relatively smaller. For this reason, solar cell module 1a according to the embodiment can have both improved weather resistance and improved heat resistance at the same time.

Note that in the embodiment, the reason why the improved heat resistance can be achieved is considered such that the gel fraction of the resin of first filler layer 13a is higher and thus the cross-linking density of the resin of first filler layer 13a is high and a fluidity of first filler layer 13a in contact with sheet 11 having flexibility higher than that of protective body 10 is low at a high temperature. Also, the reason why the improved weather resistance can be achieved is considered such that second filler layer 13b having a low gel fraction and water permeability is provided in filler layer 13.

When the gel fraction of the resin of first filler layer 13a is equal to or higher than 60%, the improved heat resistance can be achieved. The gel fraction of first filler layer 13a is preferably equal to or higher than 50%, more preferably equal to or higher than 55%, and further more preferably equal to or higher than 60%. However, if the gel fraction of the resin of first filler layer 13a is excessively high, the flexibility of the resin may be not maintainable. For this reason, the gel fraction of the resin of first filler layer 13a is preferably equal to or less than 80%.

When the gel fraction of the resin of second filler layer 13b is equal to or less than 80%, the improved weather resistance can be achieved. The gel fraction of the resin of second filler layer 13b is preferably equal to or less than 60%, more preferably equal to or less than 51%, and further more preferably equal to or less than 40%.

When the gel fraction of the resin of first filler layer 13a is equal to or higher than 1.5 times of the gel fraction of the resin of second filler layer 13b, a solar cell module having a more improved weather resistance and a more improved heat resistance can be achieved.

When the resins respectively of first and second filler layers 13a and 13b are EVA or polyethylene, a solar cell module having a more improved weather resistance, a more improved heat resistance, and a higher energy efficiency can be achieved. This is because EVA and polyethylene has a high optical transmittance and is excellent in weather resistance and heat resistance.

In the embodiment, first filler layer 13a whose fluidity is low at a high temperature and rigidity is high at a high temperature is provided in contact with solar cell 12. For this reason, the improved heat resistance can be achieved.

In the embodiment, protective body 10 provided on the light-receiving surface 12a side of solar cell 12 is formed of a glass plate having low water permeability. For this reason, water is hard to enter solar cell module 1a from the glass plate side. Accordingly, light-receiving surface 12a of solar cell 12 which has a large impact on an output of solar cell module 1a and a portion located on the light-receiving surface 12a side of filler layer 13 are difficult to be deteriorated. Accordingly, the weather resistance of solar cell module 1a can be more improved.

In particular, in the embodiment, second filler layer 13b whose gel fraction is low and water permeability is low is disposed on light-receiving surface 12a of solar cell 12 and first filler layer 13a whose water permeability is high is not disposed. For this reason, water reaching light-receiving surface 12a of solar cell 12 can be lowered. Accordingly, the deterioration of light-receiving surface 12a of solar cell 12 can be consequently suppressed. Accordingly, the weather resistance of solar cell module 1a can be more improved.

Note that solar cell module 1a according to the embodiment can be manufactured by a manufacturing method to be illustrated below, for example.

Firstly, one or a plurality of resin sheets for forming second filler layer 13b are disposed on sheet 11. Then, a plurality of solar cells 12 which are electrically connected with one another by wiring member 14 are disposed thereon, and one or a plurality of resin sheets for forming first filler layer 13a are disposed thereon. Lastly, protective body 10 is stacked. The formed stacked body is subjected to heat and pressure bonding in reduced-pressure atmosphere, so that solar cell module 1a is completed.

Hereinafter, other preferable embodiments in which the invention is implemented are described. In the following description, common reference numerals are referred to members having functions substantially common with those of the embodiment.

Second Embodiment

Figure 2:
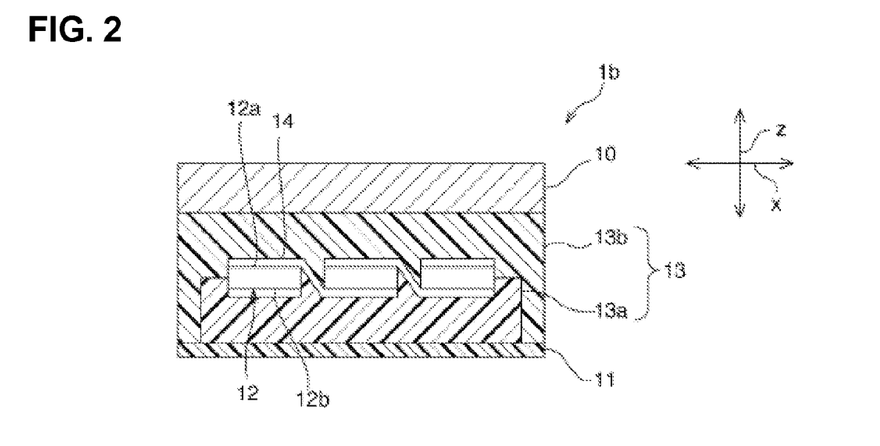
FIG. 2 is a schematic cross-sectional view of a solar cell module according to a second embodiment.

FIG. 2 is a schematic cross-sectional view of solar cell module 1b according to a second embodiment.

As shown in FIG. 2, in the embodiment, second filler layer 13b formed of a resin with a low gel fraction is provided in contact with both protective body 10 and sheet 11. Specifically, second filler layer 13b is provided in an outer edge of solar cell module 1b in such a manner as to be continuous in a stacking direction z from protective body 10 to sheet 11. In other words, when seen from the stacking direction z, second filler layer 13b is provided in an outer side of first filler layer 13a.

Note that solar cell module 1b according to the second embodiment can be manufactured by substantially the same manufacturing method as the manufacturing method described in the first embodiment in such a manner that, for example, an area of a sheet for forming first filler layer 13a is caused to be smaller than an area of a sheet for forming second filler layer 13b.

Third Embodiment

Figure 3:
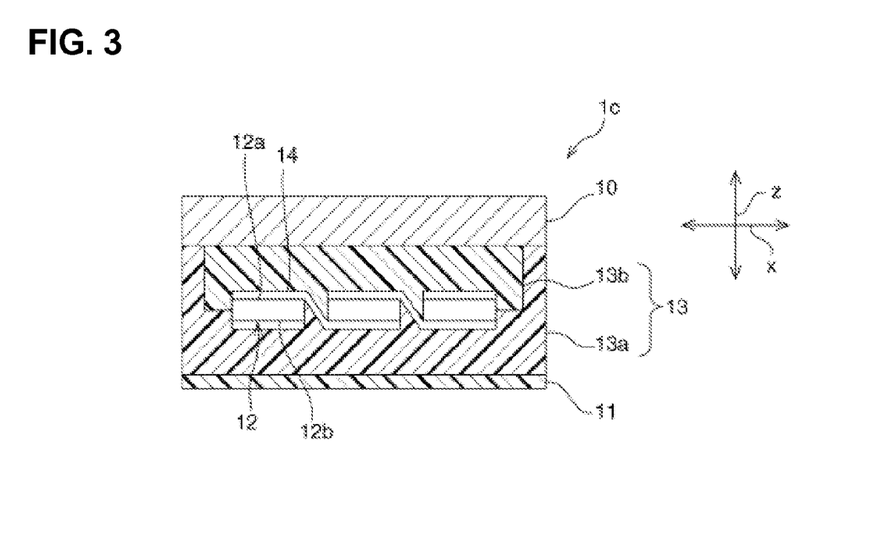
FIG. 3 is a schematic cross-sectional view of a solar cell module according to a third embodiment.

FIG. 3 is a schematic cross-sectional view of solar cell module 1c according to a third embodiment.

As shown in FIG. 3, in the embodiment, first filler layer 13c formed of a resin with a high gel fraction is provided in contact with both protective body 10 and sheet 11. Specifically, first filler layer 13a is provided in an outer edge of solar cell module 1c in such a manner as to be continuous in a stacking direction z from protective body 10 to sheet 11. In other words, when seen from the stacking direction z, first filler layer 13c is located in an outer side of second filler layer 13b.

Note that solar cell module 1c according to the third embodiment can be manufactured by substantially the same manufacturing method as the manufacturing method described in the first embodiment in such a manner that, for example, an area of a sheet for forming second filler layer 13b is caused to be smaller than an area of a sheet for forming first filler layer 13a.

Fourth Embodiment

Figure 4:
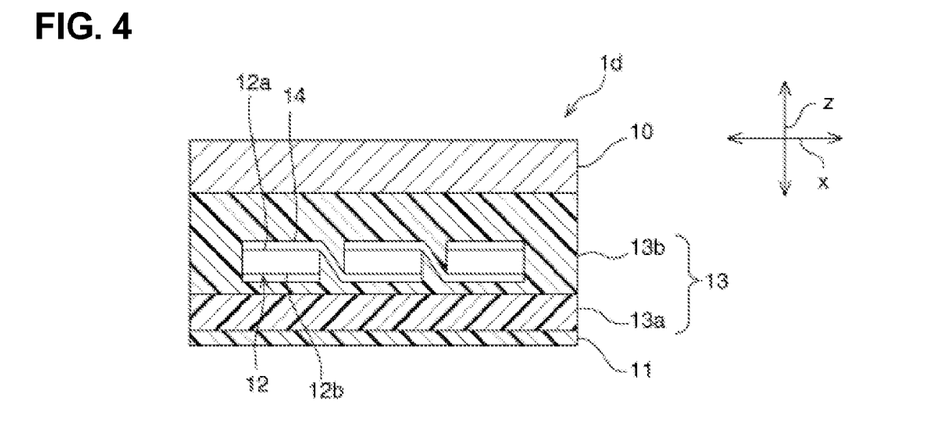
FIG. 4 is a schematic cross-sectional view of a solar cell module according to a fourth embodiment.

FIG. 4 is a schematic cross-sectional view of solar cell module 1d according to a fourth embodiment.

The above first to third embodiments describe an example in which a plurality of solar cells 12 are disposed in a boundary between first filler layer 13a and second filler layer 13b. On the other hand, in the present embodiment, as shown in FIG. 4, second filler layer 13b is formed to reach the sheet 11 side more than a plurality of solar cells 12, and solar cells 12 are disposed inside second filler layer 13b. In other words, solar cells 12 are surrounded by second filler layer 13b formed of a resin with a low gel fraction.

Note that solar cell module 1d according to the embodiment can be manufactured by substantially the same manufacturing method as the manufacturing method described in the first embodiment in such a manner that, for example, a sheet for forming second filler layer 13b is disposed between a sheet for forming first filler layer 13a and solar cells 12.

Fifth Embodiment

Figure 5:
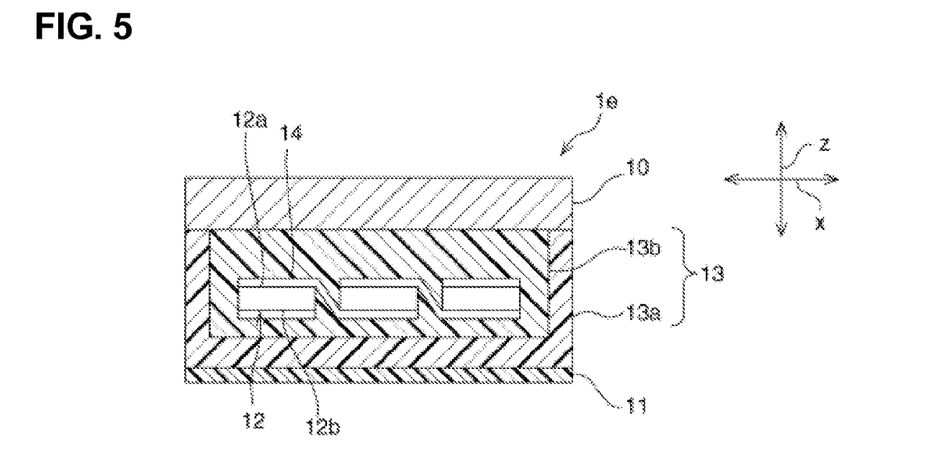
FIG. 5 is a schematic cross-sectional view of a solar cell module according to a fifth embodiment.

FIG. 5 is a schematic cross-sectional view of solar cell module 1e according to a fifth embodiment.

As shown in FIG. 5, solar cell module 1e according to the embodiment is different from solar cell module 1d according to the fourth embodiment in that as similar to the third embodiment, first filler layer 13a is provided in an outer edge of solar cell module 1e in such a manner as to be continuous in a stacking direction z from protective body 10 to sheet 11. For this reason, in the embodiment, when seen from the stacking direction z, first filler layer 13c is located in an outer side of second filler layer 13b.

Sixth Embodiment

Figure 6:
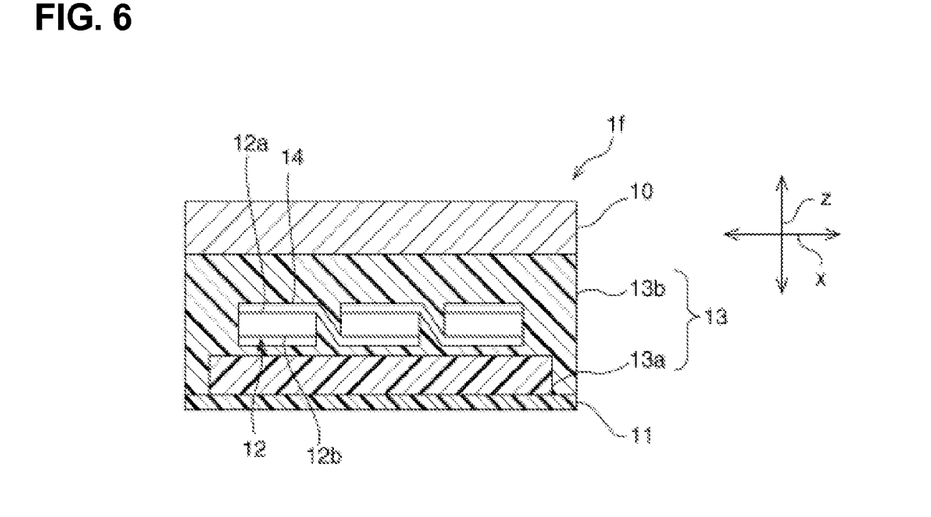
FIG. 6 is a schematic cross-sectional view of a solar cell module according to a sixth embodiment.

FIG. 6 is a schematic cross-sectional view of solar cell module 1f according to a sixth embodiment.

As shown in FIG. 6, solar cell module 1f according to the embodiment is different from solar cell module 1d according to the fourth embodiment in that as similar to the second embodiment, second filler layer 13b is provided in an outer edge of solar cell module 1f in such a manner as to be continuous in a stacking direction z from protective body 10 to sheet 11. For this reason, in the embodiment, when seen from the stacking direction z, first filler layer 13b is located in an outer side of second filler layer 13b.

Seventh Embodiment

Figure 7:
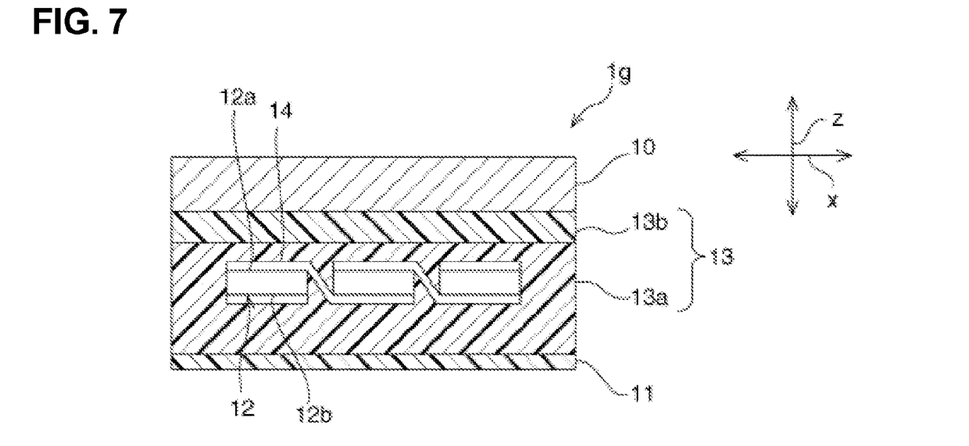
FIG. 7 is a schematic cross-sectional view of a solar cell module according to a seventh embodiment.

FIG. 7 is a schematic cross-sectional view of solar cell module 1g according to a seventh embodiment.

As shown in FIG. 7, solar cell module according to the embodiment is different from solar cell module 1a according to the first embodiment in that first filler layer 13a is provided in such a manner as to reach a protective body 10 side more than a plurality of solar cells 12, and the plurality of solar cells 12 are disposed inside first filler layer 13a.

Note that solar cell module 1g according to the embodiment can be manufactured by substantially the same manufacturing method as the manufacturing method described in the first embodiment in such a manner that a sheet for forming first filler layer 13a is disposed before solar cell 12 is disposed on a sheet for forming second filler layer 13b.

Eighth Embodiment

Figure 8:
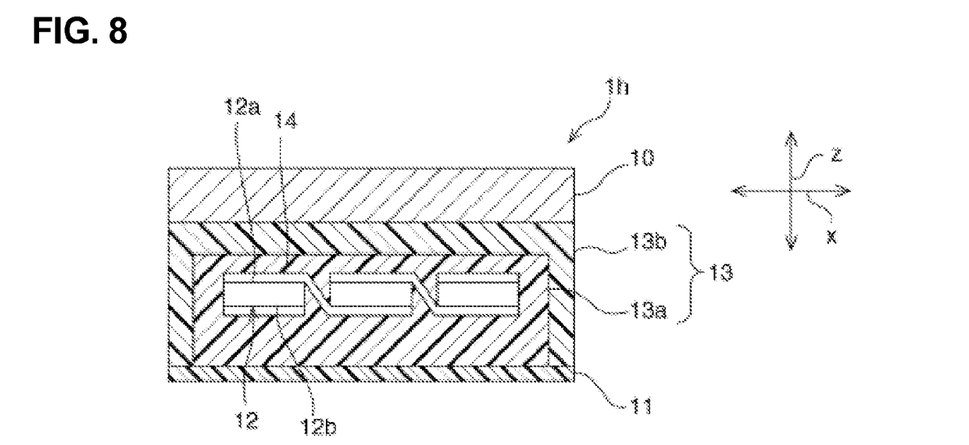
FIG. 8 is a schematic cross-sectional view of a solar cell module according to an eighth embodiment.

FIG. 8 is a schematic cross-sectional view of solar cell module 1h according to an eighth embodiment.

As shown in FIG. 8, solar cell module 1h according to the embodiment is different from solar cell module 1g according to the seventh embodiment in that as similar to the second and sixth embodiments, second filler layer 13b is provided in an outer edge of solar cell module 1h in such a manner as to be continuous in a stacking direction z from protective body 10 to sheet 11. For this reason, in the embodiment, when seen from the stacking direction z, first filler layer 13b is located in an outer side of second filler layer 13b.

Ninth Embodiment

Figure 9:
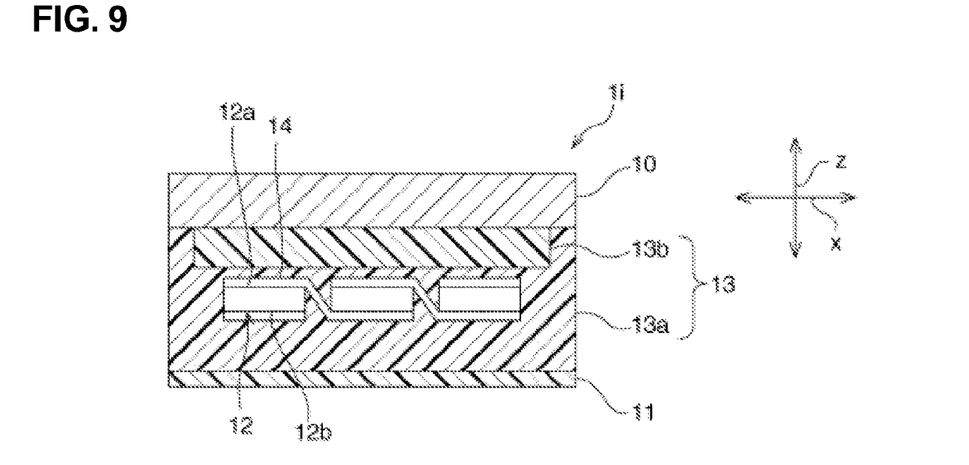
FIG. 9 is a schematic cross-sectional view of a solar cell module according to a ninth embodiment.

FIG. 9 is a schematic cross-sectional view of solar cell module 1i according to a ninth embodiment.

As shown in FIG. 9, solar cell module 1i according to the embodiment is different from solar cell module 1g according to the seventh embodiment in that as similar to the third and fifth embodiments, first filler layer 13a is provided in an outer edge of solar cell module 1i in such a manner as to be continuous in a stacking direction z from protective body 10 to sheet 11. For this reason, in the embodiment, when seen from the stacking direction z, first filler layer 13c is located in an outer side of second filler layer 13b.

Tenth to Twelfth Embodiments

Figure 10:
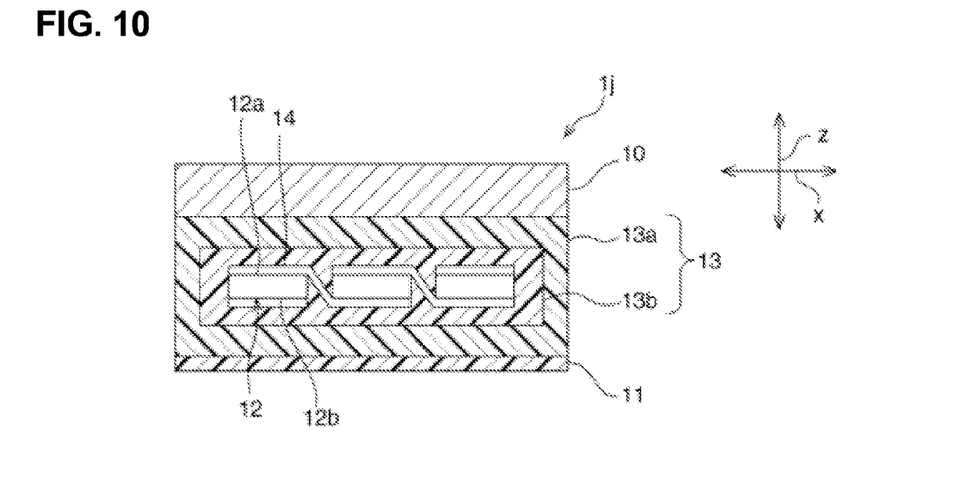
FIG. 10 is a schematic cross-sectional view of a solar cell module according to a tenth embodiment.
Figure 11:
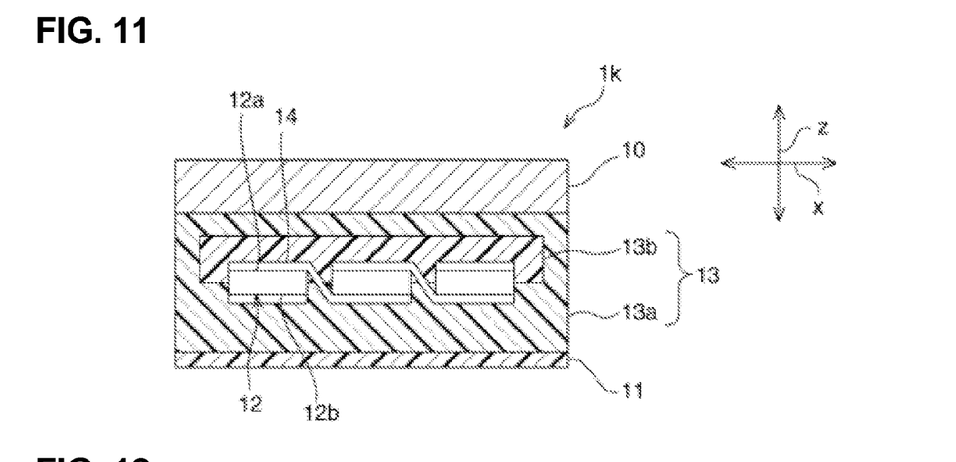
FIG. 11 is a schematic cross-sectional view of a solar cell module according to an eleventh embodiment.
Figure 12:
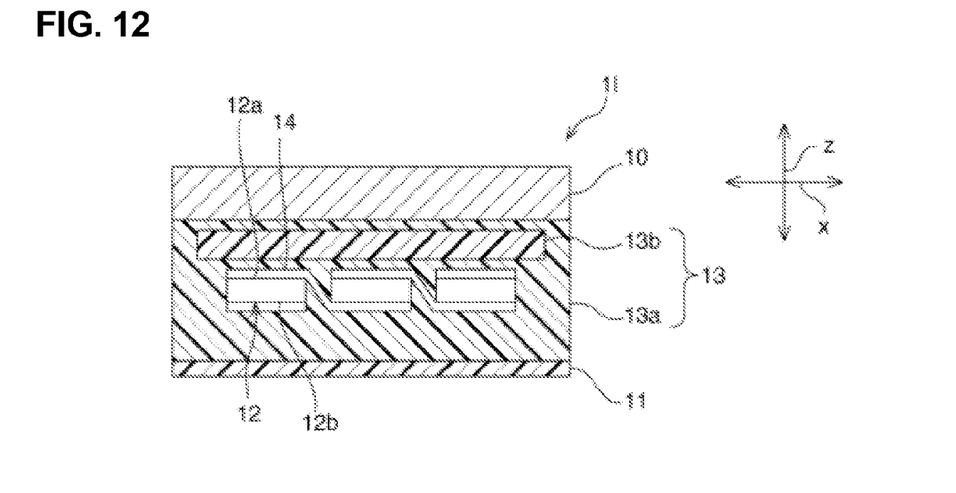
FIG. 12 is a schematic cross-sectional view of a solar cell module according to a twelfth embodiment.

FIG. 10 is a schematic cross-sectional view of solar cell module 1j according to a tenth embodiment. FIG. 11 is a schematic cross-sectional view of solar cell module 1k according to an eleventh embodiment. FIG. 12 is a schematic cross-sectional view of solar cell module 1l according to a twelfth embodiment.

As shown in FIGS. 10 to 12, in the tenth to twelfth embodiments, first filler layer 13a is in contact with both protective body 10 and sheet 11. First filler layer 13a is provided to surround second filler layer 13b.

As shown in FIG. 10, in the tenth embodiment, a plurality of solar cells 12 are disposed inside second filler layer 13b.

As shown in FIG. 11, in the eleventh embodiment, a plurality of solar cells 12 are disposed in a boundary between first filler layer 13a and second filler layer 13b.

As shown in FIG. 12, in the twelfth embodiment, a plurality of solar cells 12 are disposed inside first filler layer 13a.

Even in solar cell modules 1b to 1l according to the second to twelfth embodiments, as similar to solar cell module 1a according to the first embodiment, first filler layer 13 formed of a resin having a high gel fraction is provided in contact with sheet 11 and second filler layer 13b formed of a resin having a low gel fraction is provided. For this reason, improved weather resistance and improved heat resistance can be achieved at the same time.

Also, even in the second, third, and eleventh embodiments, as similar to the first embodiment, first filler layer 13a formed of a resin having a high gel fraction is provided in contact with the plurality of solar cells 12. Accordingly, more improved heat resistance can be achieved.

Even in the second to sixth embodiments, as similar to the first embodiment, second filler layer 13b formed of a resin having a low gel fraction is disposed on a light-receiving surface 12a side of the solar cells 12 and first filler layer 13a formed of a resin having a high gel fraction is not disposed. Accordingly, more excellent heat resistance can be achieved.

In the fourth to sixth and tenth embodiments, a plurality of solar cells 12 are disposed inside second filler layer 13b. In other words, the plurality of solar cells 12 are surrounded by second filler layer 13b formed of a resin with a low gel fraction. For this reason, water can be effectively prevented from reaching the plurality of solar cells 12. Accordingly, the deterioration of solar cells 12 due to water can be effectively suppressed. Accordingly, more improved weather resistance can be achieved.

In the seventh to ninth and twelfth embodiments, a plurality of solar cells 12 are disposed inside first filler layer 13a. In other words, the plurality of solar cells 12 are surrounded by first filler layer 13a formed of a resin with a high gel fraction. For this reason, even in high-temperature atmosphere, a plurality of solar cells 12 are suitably protected by first filler layer 13a. Accordingly, further improved heat resistance can be achieved.

In the third, fifth and ninth to twelfth embodiments, first filler layer 13a formed of a resin with a high gel fraction is provided in contact with both protective body 10 and sheet 11. For this reason, deformation of filler layer 13 at a high temperature can be effectively suppressed. In particular, in the third, fifth and ninth to twelfth embodiments, first filler layer 13a is located in an outer side of second filler layer 13b. Accordingly, the fluidity of second filler layer 13b formed of a resin having a low gel fraction at a high temperature is effectively suppressed. Accordingly, more improved heat resistance can be achieved.

Among them, in the tenth to twelfth embodiments, second filler layer 13b is surrounded by first filler layer 13a. For this reason, the fluidity of second filler layer 13b at a high temperature is effectively suppressed. Accordingly, further improved heat resistance can be achieved.

In the second, sixth, and eighth embodiments, second filler layer 13b formed of a resin having a low gel fraction is provided in contact with both protective body 10 and sheet 11. Specifically, second filler layer 13b is provided in an outer edge of solar cell modules 1b, 1f, and 1h in such a manner as to be continuous from protective body 10 to sheet 11. For this reason, water permeability to solar cell modules 1b, 1f, and 1h from the outer edges of solar cell modules 1b, 1f, and 1h is effectively suppressed. Accordingly, more improved weather resistance can be achieved.

EXAMPLES

Examples 1 to 3, Comparative Examples 1 to 3

In Examples 1 to 3 and Comparative examples 1 to 3, solar cell modules A1 to A3 (Examples 1 to 3) and B1 to B3 (Comparative examples 1 to 3), each having the same configuration as that of solar cell module 1a according to the first embodiment are prepared in the following procedures.

Firstly, an EVA sheet, a plurality of solar cells 12, another EVA sheet, and sheet 11 are stacked on protective body 10 formed of a glass plate in this order. The EVA sheet contains a cross-linking agent as a filler and has a thickness of 0.6 mm. The plurality of solar cells 12 are electrically connected by wiring member 14. The other EVA sheet contains a cross-linking agent as a filler and has a thickness of 0.6 mm.

Note that in each example and each comparative example, an amount of the cross-linking agent contained in the resin constituting first filler layer 13a and an amount of the cross-linking agent contained in the resin constituting second filler layer 13b are as shown below in Table 1. Note that the amount of the cross-linking agent shown in Table 1 is a relative ratio of mass when a mass of the cross-linking agent added when solar cell module B1 according to Comparative example 1 is prepared is regarded as 100%.

As sheet 11, a polyethylene-terephthalate sheet with a thickness of 150 μm.

A plurality of fingers and two bus bars are provided as electrodes on both principal surfaces of used solar cell 12. The plurality of fingers extend in parallel with each other and the two bus bars are provided perpendicular to the fingers and separated from each other in a direction in which the fingers extend.

After that, the obtained stacked body is integrated by a stacking method and is stored in a frame made of aluminum, so that a solar cell module is prepared. Note that the integration by the stacking method is performed by applying pressure for five minutes after reducing pressure for five minutes by using a reduced-pressure pump.

Then, it is heated at 150° C. to perform a curing process. Table 2 illustrates a relationship among the amount of added cross-linking agent, a curing time, and gel fractions of filler layers 13a and 13b. Table 2 provides gel fractions in each of Example and Comparative examples shown in Table 1.

TABLE 1

| | Amount of Cross-linking Agent (%) | | | Gel Fraction (%) | |
|---|---|---|---|---|---|
| | First Filler Layer | Second Filler Layer | Curing Time (minutes) | First Filler Layer | Second Filler Layer |
| Solar Cell Module A1 | 100 | 50 | 60 | 80 | 51 |
| Solar Cell Module A2 | 100 | 0 | 60 | 80 | 2 |
| Solar Cell Module A3 | 100 | 0 | 20 | 55 | 2 |
| Solar Cell Module B1 | 100 | 100 | 60 | 80 | 80 |
| Solar Cell Module B2 | 0 | 0 | 60 | 2 | 2 |
| Solar Cell Module B3 | 100 | 0 | 0 | 5 | 0 |

TABLE 2

| | Amount of Cross-Linking Agent | | |
|---|---|---|---|
| Curing Time | 100 | 50 | 0 |
| 0 | 5% | 3% | 0% |
| 20 | 55% | 24% | 2% |
| 60 | 80% | 51% | 2% |

Hereinafter, with regard to the solar cell modules prepared in Examples 1 to 3 and Comparative Example 1 to 3, the high temperature/high humidity test and the temperature cycling test which are regulated by JIS C8991 (2004) are conducted.

Specifically, the high temperature/humidity test is conducted in such a manner that a solar cell module is left in a high temperature/humidity chamber under the conditions within a range of a temperature: 85±2° C. and a relative humidity: 85±5° C. for 1000 hours. Then, an output decreasing rate of the solar cell module before and after the high temperature/humidity test ((the output after the high temperature/humidity test)/(the output before the high temperature/humidity test)) is measured. Also, a resistance increasing rate between the two bus bars on light-receiving surface 12a before and after the high temperature/humidity test ((the resistance after the high temperature/humidity test)−(the resistance before the high temperature/humidity test)) is measured.

In a state where a continuity monitoring device is connected between both terminals of the prepared solar cell module and an insulation performance monitoring device is connected between one of the terminals of the solar cell module and a frame, the temperature cycling test is conducted by performing 200 times of cycles in each of which a temperature of the solar cell module is increased from a temperature within a range of −40±2° C. to a temperature within a range of 90±2° C. at 100° C./hour, which is held for 10 minutes, and, thereafter, is cooled down to a temperature within a range of −40±2° C. at 100° C./hour, which is held for 10 minutes, and, thereafter, is increased again to a temperature within a range of 90±2° C. at 100° C./hour. In this test, air around the solar cell module is circulated at 2 m/second. Also, in the test, the solar cell module is exposed to light having AM of 1.5 and an intensity of 100 mW/cm2. Then, the output decreasing rate of the solar cell module before and after the temperature cycling test ((the output after the temperature cycling test)/(the output before the temperature cycling test)) is measured.

Figure 13:
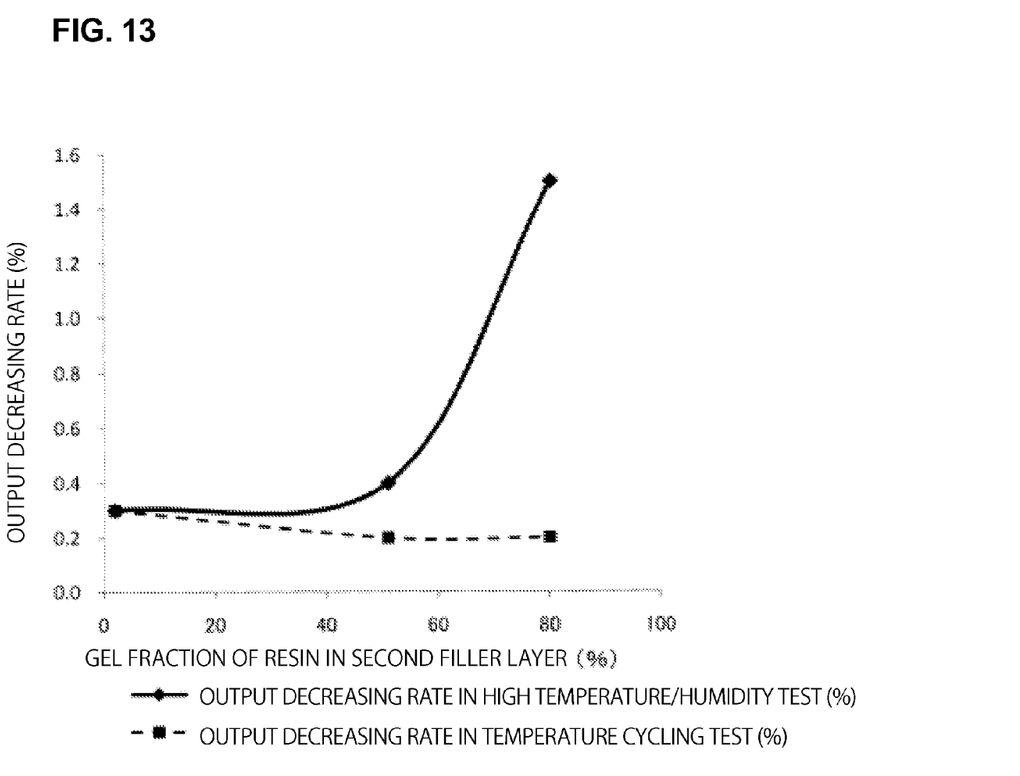
FIG. 13 is a graph illustrating a relationship between an output decreasing rate in each of the high temperature/humidity text and the temperature cycling test of solar cell modules A1, A2, and B1 and a gel fraction of a resin in a second filler layer.
Figure 14:
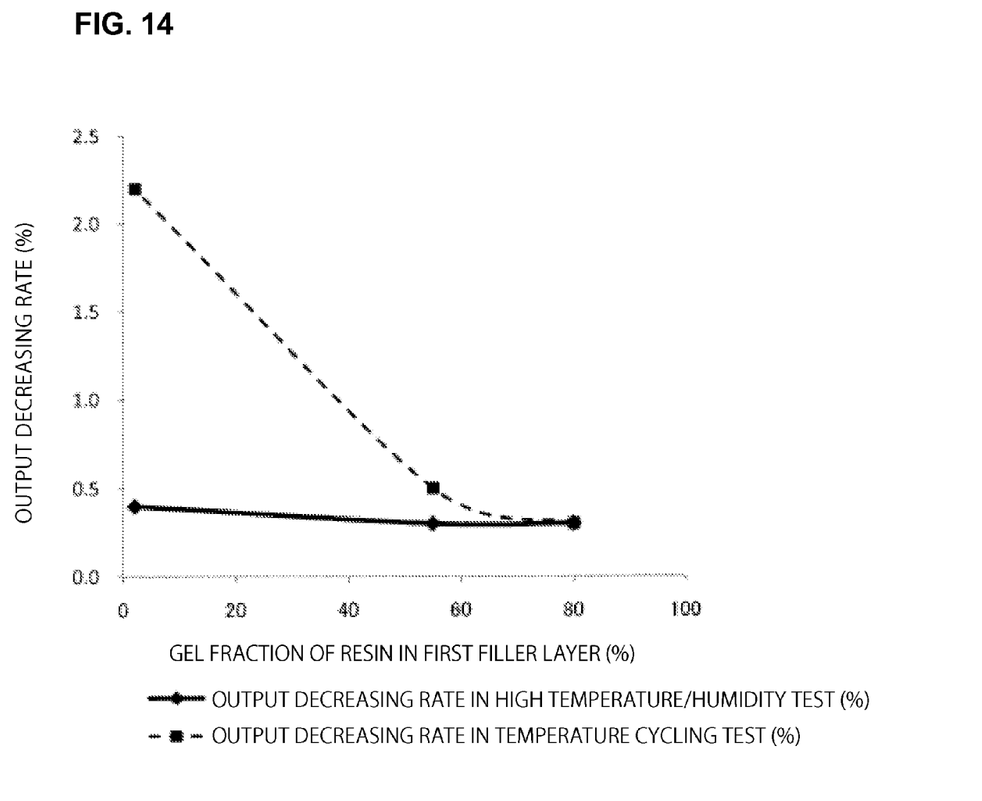
FIG. 14 is a graph illustrating a relationship between an output decreasing rate in each of the high temperature/humidity text and the temperature cycling test of solar cell modules A2, A3, and B2 and a gel fraction of a resin in a first filler layer.

The results are shown in following Table 3. Also, FIG. 13 shows a graph illustrating a relationship between an output decreasing rate in each of the high temperature/humidity test and the temperature cycling test on solar cell modules A1, A2, and B1 whose gel fraction of the resin in first filler layer 13a is 80% and the gel fraction of the resin in the second filler layer. FIG. 14 shows a graph illustrating a relationship between an output decreasing rate in each of the high temperature/humidity test and the temperature cycling test on solar cell modules A2, A3, and B2 whose gel fraction of the resin in second filler layer 13b is 2% and the gel fraction of the resin in the first filler layer.

TABLE 3

| | Gel Fraction | | | High Temperature/Humidity Test | | Temperature Cycling Test | |
|---|---|---|---|---|---|---|---|
| | First Filler Layer (%) | Second Filler Layer (%) | First Filler Layer/Second Filler layer | Output Decreasing Rate (%) | Resistance Increasing Rate (%) | Output Decreasing Rate (%) | Resistance Increasing Rate (%) |
| Solar Cell Module A1 | 80 | 51 | 1.57 | 0.4 | 0.3 | 0.2 | 0.1 |
| Solar Cell Module A2 | 80 | 2 | 40 | 0.3 | 0.2 | 0.3 | 0.3 |
| Solar Cell Module A3 | 55 | 2 | 27.5 | 0.3 | 0.3 | 0.5 | 0.4 |
| Solar Cell Module B1 | 80 | 80 | 1 | 1.5 | 1.1 | 0.2 | 0.1 |
| Solar Cell Module B2 | 2 | 2 | 1 | 0.4 | 0.5 | 2.2 | 1.8 |
| Solar Cell Module B3 | 5 | 0 | — | 0.5 | 0.5 | 1.9 | 1.8 |

The results shown in Table 3 show that solar cell modules A1 to A3 whose gel fraction of the resin of second filler layer 13b is larger than 0% and is less than the gel fraction of the resin of first filler layer 13a have improved heat resistance and excellent weather resistance.

On the other hand, solar cell modules B1 and B2 whose gel fraction of the resin of first filler layer 13a is equal to the gel fraction of the resin of second filler layer 13b have poor heat resistance and weather resistance. Specifically, solar cell module B1 whose gel fraction of the resin of first and second filler layers 13a and 13b has poor weather resistance. On the other hand, solar cell module B2 whose gel fraction of the resin of first and second filler layers 13a and 13b has poor heat resistance.

Also, solar cell module B3 whose gel fraction of the resin of second filler layer 13b is 0% has poor heat resistance.

The results shown in FIG. 13 illustrates that the output decreasing rate in the high temperature/humidity test becomes larger as the gel fraction of the resin in second filler layer 13b becomes higher. On the other hand, it can be seen that the output decreasing rate in the temperature cycling test does not greatly change even when the gel fraction of the resin in second filler layer 13b changes. In other words, it can be seen that the gel fraction of the resin in second filler layer 13b has a great impact on weather resistance but not so much impact on heat resistance. Also, it can be seen that improved weather resistance is obtainable by causing the gel fraction of the resin in second filler layer 13b to be smaller. The results shown in FIG. 14 illustrates that the output decreasing rate in the high temperature/humidity test does not change even when the gel fraction of the resin in first filler layer 13a changes. On the other hand, it can be seen that the output decreasing rate in the temperature cycle test becomes larger as the gel fraction of the resin in first filler layer 13a becomes higher. In other words, it can be seen that the gel fraction of the resin in first filler layer 13a has a great impact on heat resistance but not so much impact on weather resistance. Also, it can be seen that improved heat resistance is obtainable by causing the gel fraction of the resin in first filler layer 13a to be higher.

From the above-described results, the gel fraction of the resin of second filler layer 13b is set to be higher than 0% and be less than the gel fraction of the resin of first filler layer 13a, so that both improved heat resistance and improved weather resistance can be obtained at the same time.

As shown in FIG. 14, when the gel fraction of the resin in first filler layer 13a is less than 55%, an increased rate of the output decreasing rate in the temperature cycle along with the decreasing gel fraction of the resin in first filler layer 13a is large. On the other hand, when the gel fraction of the resin of first filler layer 13a is equal to or higher than 55%, the output decreasing rate in the temperature cycling test is low regardless of the gel fraction of the resin in first filler layer 13a. In particular, when the gel fraction of the resin of first filler layer 13a is equal to or lager than 60%, an amount of change in the output decreasing rate in the temperature cycling test along with the change in the gel fraction of the resin in first filler layer 13a is small. From the above results, it can be seed that the gel fraction of the resin in first filler layer 13a is preferably equal to or larger than 55%, and more preferably equal to or larger than 60%.

As shown in FIG. 13, when the gel fraction of the resin in second filler layer 13b is higher than 51%, an increased rate of the output decreasing rate in the high temperature/humidity test along with the increasing gel fraction of the resin in second filler layer 13a is large. On the other hand, when the gel fraction of a resin in second filler layer 13b is equal to or less than 51%, the output decreasing rate in the high temperature and high humidity test is low regardless of the gel fraction of a resin in second filler layer 13b. In particular, when the gel fraction of the resin in second filler layer 13b is equal to or less than 40%, an amount of change in the output decreasing rate in the high temperature/humidity test along with the change in the gel fraction of the resin in second filler layer 13b is small. From the above results, it can be seed that the gel fraction of the resin in second filler layer 13b is preferably equal to or less than 51%, and more preferably equal to or less than 40%.

The invention includes various embodiments which are not described herein. For example, a solar cell used in the invention may be a rear junction solar cell. Accordingly, a technical scope of the invention is defined only by subject matters according to the scope of claims which are appropriate from the above description.

The invention claimed is:

1. A solar cell module having improved resistance to moisture and heat cycling, comprising:
    a protective body on a light incident side of the solar cell module;
    a sheet facing the protective body;
    a solar cell having first and second main opposing surfaces disposed between the protective body and the sheet;
    a first filler layer provided between the first main surface of the solar cell and the sheet and which touches the sheet; and
    a second filler layer provided between the second main surface of the solar cell and the protective body, wherein
    the first filler layer has a gel fraction of at least 60% and is at least 1.5 times the gel fraction of the second filler layer having a gel fraction of at least 2%.

2. The solar cell module according to claim 1, wherein the gel fraction of the resin of the first filler layer is no more than 80%.

3. The solar cell module according to claim 1, wherein each of the resin of the first filler layer and the resin of the second filler layer is ethylene-vinyl acetate copolymer or polyethylene.

4. The solar cell module according to claim 2, wherein each of the resin of the first filler layer and the resin of the second filler layer is ethylene-vinyl acetate copolymer or polyethylene.

5. The solar cell module according to claim 1, wherein the first filler layer is in contact with the solar cell.

6. The solar cell module according to claim 1, wherein the protective body comprises a glass plate, and the sheet comprises a resin sheet.

7. The solar cell module according to claim 1, wherein the second filler layer is provided in an outer edge of the solar cell module as to completely surround the perimeter of the first filler layer as viewed perpendicular to the plane of the solar cell module.

8. The solar cell module according to claim 1, wherein the boundary between the first filler layer and the second filler layer is not exposed to a side surface of the solar cell module.

* * * * *